United States Patent
Tu et al.

(10) Patent No.: US 7,232,629 B2
(45) Date of Patent: Jun. 19, 2007

(54) METHOD OF FORMING AND TESTING A PHASE SHIFT MASK

(75) Inventors: Lin-Hsin Tu, Taipei (TW); Kun-Rung Lin, Hsin-Chu (TW)

(73) Assignee: United Microelectronics Corp., Hsin-Chu (TW)

(*) Notice: Subject to any disclaimer, the term of this patent is extended or adjusted under 35 U.S.C. 154(b) by 485 days.

(21) Appl. No.: 10/708,869

(22) Filed: Mar. 30, 2004

(65) Prior Publication Data
US 2004/0224240 A1    Nov. 11, 2004

(30) Foreign Application Priority Data
Apr. 1, 2003    (CN) .............................. 03 1 21280

(51) Int. Cl.
*G03F 1/00*    (2006.01)
(52) U.S. Cl. ........................................................... 430/5
(58) Field of Classification Search .................... 430/5, 430/394; 438/275
See application file for complete search history.

(56) References Cited

U.S. PATENT DOCUMENTS

| | | | | |
|---|---|---|---|---|
| 5,578,421 A | * | 11/1996 | Hasegawa et al. | 430/313 |
| 6,001,512 A | * | 12/1999 | Tzu et al. | 430/5 |
| 6,528,836 B2 | * | 3/2003 | Lee | 257/298 |

* cited by examiner

*Primary Examiner*—S. Rosasco
(74) *Attorney, Agent, or Firm*—Winston Hsu

(57) ABSTRACT

A surface of a mask substrate is divided into a main field region and a blank periphery region surrounding the main field region. A first pattern, at least one second pattern and at least one third pattern are formed within the main field region to form a phase shift mask (PSM). By using the PSM, a pattern transferring process is performed to transfer the first pattern, the second pattern and the third pattern to a semiconductor wafer. Finally, by using the second and third patterns transferred to the semiconductor wafer, a PSM test is performed.

20 Claims, 10 Drawing Sheets

METHOD OF FORMING AND TESTING A PHASE SHIFT MASK

BACKGROUND OF INVENTION

1. Field of the Invention

The present invention relates to a method of forming and testing a phase shift mask (PSM), and more specifically, to a method of performing a PSM test by using the formed PSM.

2. Description of the Prior Art

In semiconductor processes, it is necessary to form designed patterns on a photomask in order to numerously and repetitively define an integrated circuit. Because the pattern transferred to the semiconductor wafer has a narrow line width, improvements to the resolution of the photomask are required. Such improvements insure that the pattern on the photomask is correctly transferred to the semiconductor wafer, which subsequently ensures that later etching and ion implantation processes proceed successfully.

The primarily method in the prior art for improving resolution is to use a phase shift mask (PSM) to improve the resolution of the pattern transferred to the semiconductor wafer. The prior art phase shift mask comprises a flat glass substrate, a phase shifter layer, and a chromium (Cr) layer with a pattern on it. The pattern on the Cr layer is formed by the exposure and the development processes. When transferring the pattern of the PSM onto the semiconductor wafer, the phase shifter layer can generate 180° phase shift angle for the light penetrating through, which can reduce the pattern boundary vibration so that the pattern can be accurately transferred onto the semiconductor wafer.

Please refer to FIG. 1 to FIG. 4 of cross-sectional views of forming a phase shift mask 20 according to the prior art. As shown in FIG. 1, a phase shift layer 12, a chrome blinding layer 14 and a photoresist layer (not shown) are formed in sequence from bottom to top on a quartz mask substrate. The photoresist layer is patterned with an e-beam and forms a patterned first photoresist layer 16. As shown in FIG. 2, one first etching process is performed, using the first photoresist layer 16 as mask, in order to remove those portions of the blinding layer 14 that are not covered by the first photoresist layer 16. The first photoresist layer is then completely removed.

As shown in FIG. 3, a photoresist layer (not shown) is formed on top of the phase shift layer 12 and blinding layer 14. Again, the photoresist layer is patterned with an e-beam to form a patterned second photoresist layer 18. The patterned area that is defined by the second photoresist layer 18 is larger than the area of the blinding area 14, and covers the blinding area 14 completely. The phase shift region is thus formed around the blinding pattern. As shown in FIG. 4, a second etching process is performed on the phase shift layer in order to remove the phase shift layer 12 that is not covered by the second photoresist layer 18. The second photoresist layer 18 is then completely removed, which finishes the prior art process of forming the phase shift mask 20.

As the process line width decreases, the alignment accuracy (AA) and the focal condition of the lithography process play a more and more important roll in semiconductor production. In order to make the PSM precisely aligned with the semiconductor wafer, a plurality of alignment mark, also called verniers, are formed within a periphery region of the PSM surface. In most cases, the alignment marks are formed within a scribe line region of the PSM surface and transferred to the photoresist layer of the semiconductor wafer. A phase shift mask test (PSM test), comprising a registration test, a phase angle test and a transparency test, is performed by using the alignment marks transferred to the semiconductor wafer, so as to ensure the yield rates of subsequent process.

However, the alignment marks according to the prior art are formed within the scribe line region instead of the main field region of the phase shift mask 20, so that the etching uniformity of portions of the phase shift mask 20 cannot be precisely monitored. In addition, the registration test, phase angle test and the transparency test are respectively performed in different processes, leading to increased production lead-time and raised manufacturing cost. Consequently, the product becomes less competitive in the market.

SUMMARY OF INVENTION

It is therefore a primary object of the present invention to provide a method of forming and testing a phase shift mask (PSM) so as to monitor the etching uniformity of portions of the PSM within a main field region of the PSM more precisely.

According to the claimed invention, a surface of a mask substrate comprises a main field region and a blank periphery region surrounding the main field region. By forming a first pattern, at least a second pattern and at least a third pattern within the main field region, the PSM is formed. A pattern transferring process, comprising a lithography process and an etching process, is performed by using the PSM to transfer the first pattern, the second pattern and the third pattern to a semiconductor wafer with a photoresist layer positioned on a surface of the semiconductor wafer. Finally, by using the second and third patterns transferred to the semiconductor wafer, a PSM test is performed.

It is an advantage of the present invention against the prior art that the first, second and third patterns are formed either on the border or the center of the main field region. Therefore, the PSM test is performed by using the second and third patterns transferred to the semiconductor wafer in subsequent processes to more accurately monitor the etching uniformity of portions of the PSM within the main field region. In addition, a registration test, a phase angle test and a transparency test of the PSM are simultaneously performed in a single step. The manufacturing processes are thus simplified, and the production lead-time is reduced as well. Consequently, the production cost is significant saved, making the product more competitive in the market.

These and other objectives of the present invention will no doubt become obvious to those of ordinary skill in the art after reading the following detailed description of the preferred embodiment, which is illustrated in the multiple figures and drawings.

DETAILED DESCRIPTION

Figure 1:
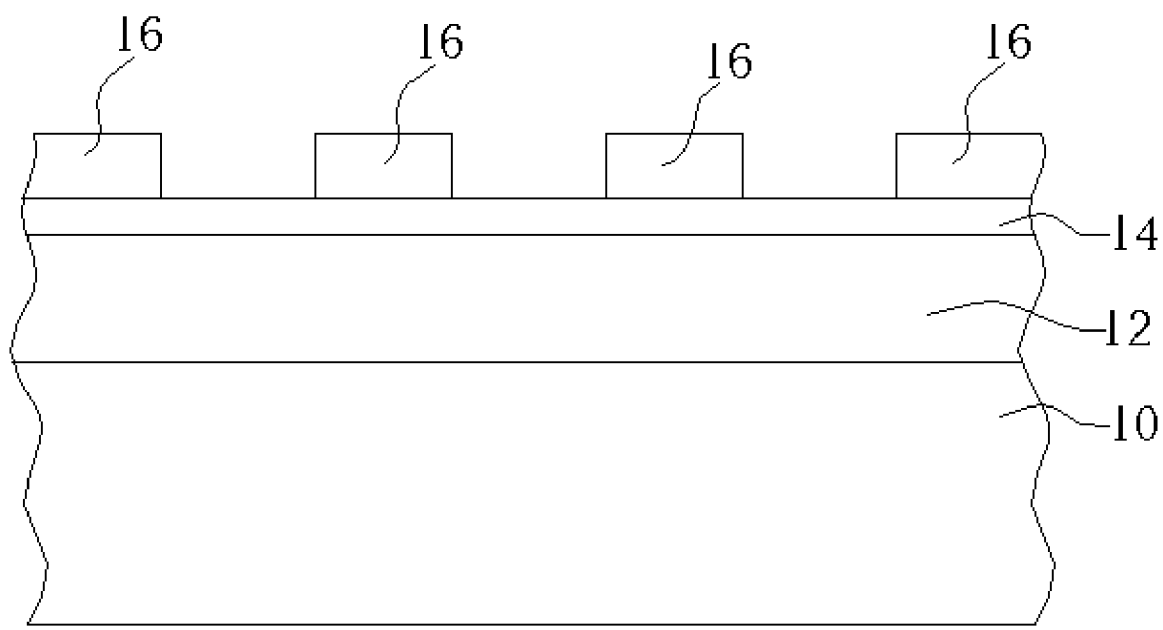
FIG. 1 to FIG. 4 are cross-sectional views of forming a phase shift mask according to the prior art.
Figure 2:
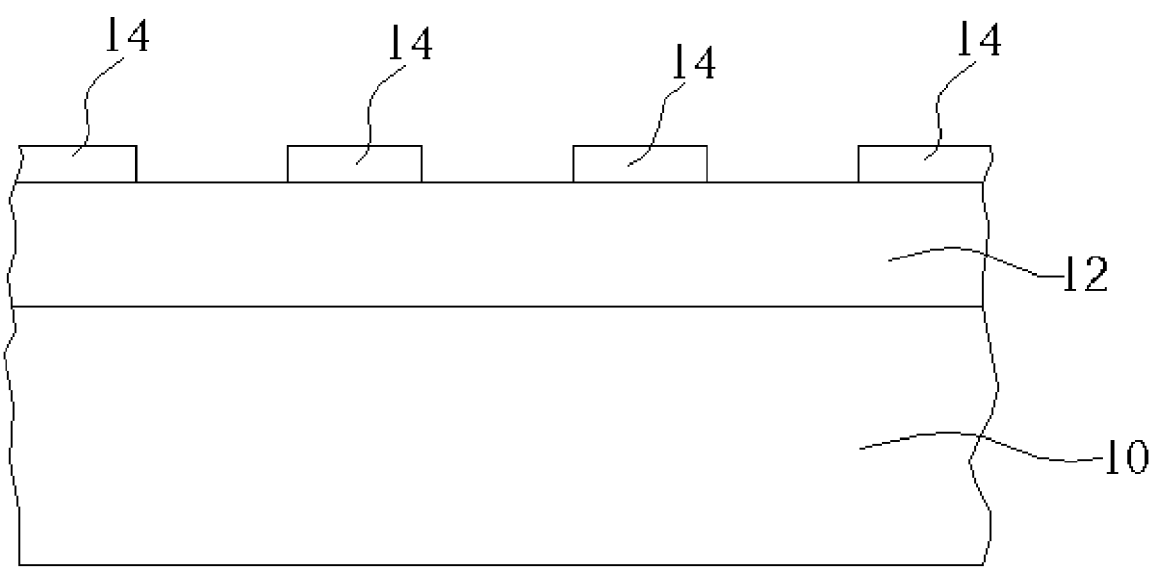
Figure 3:
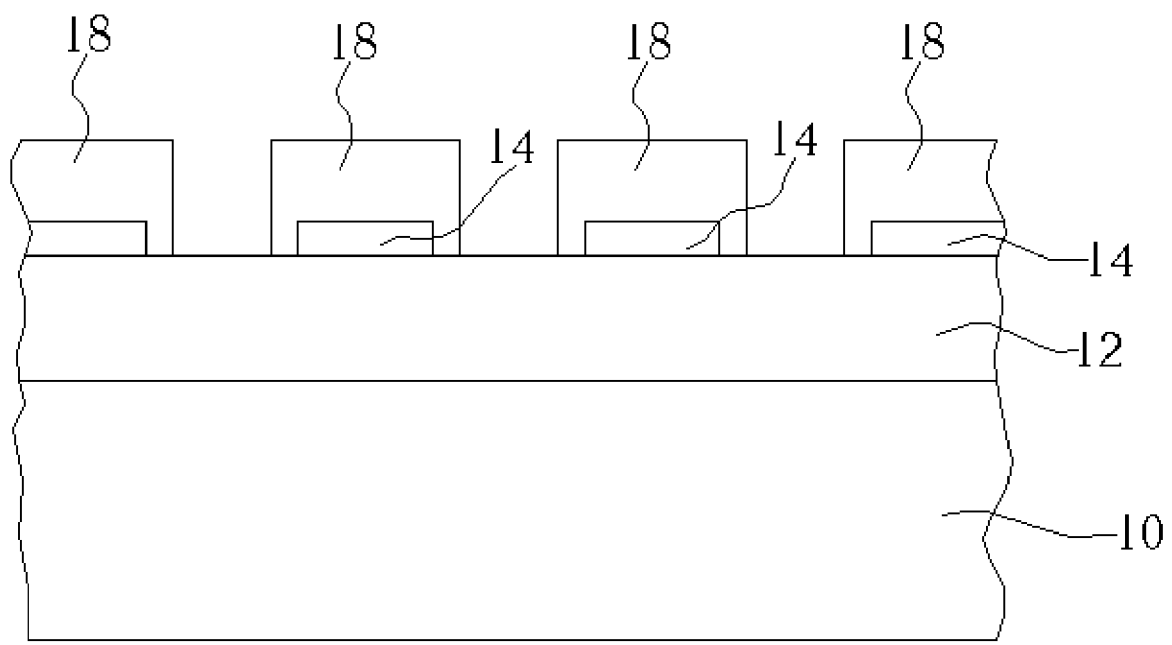
Figure 4:
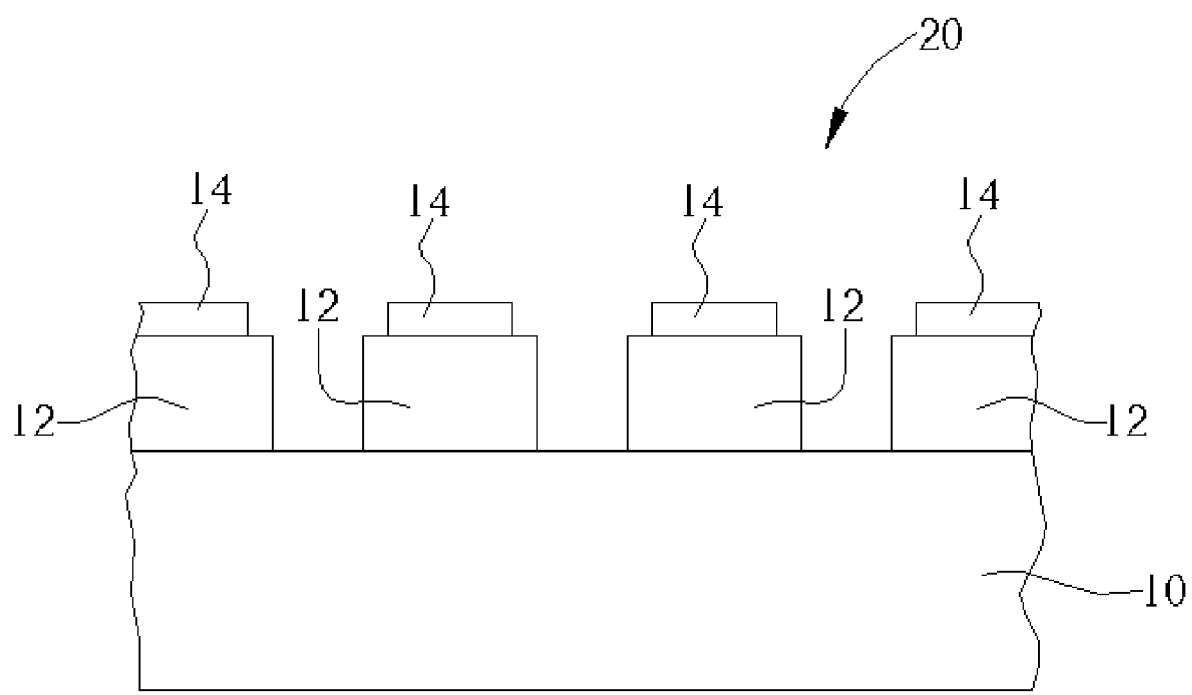
Figure 5:
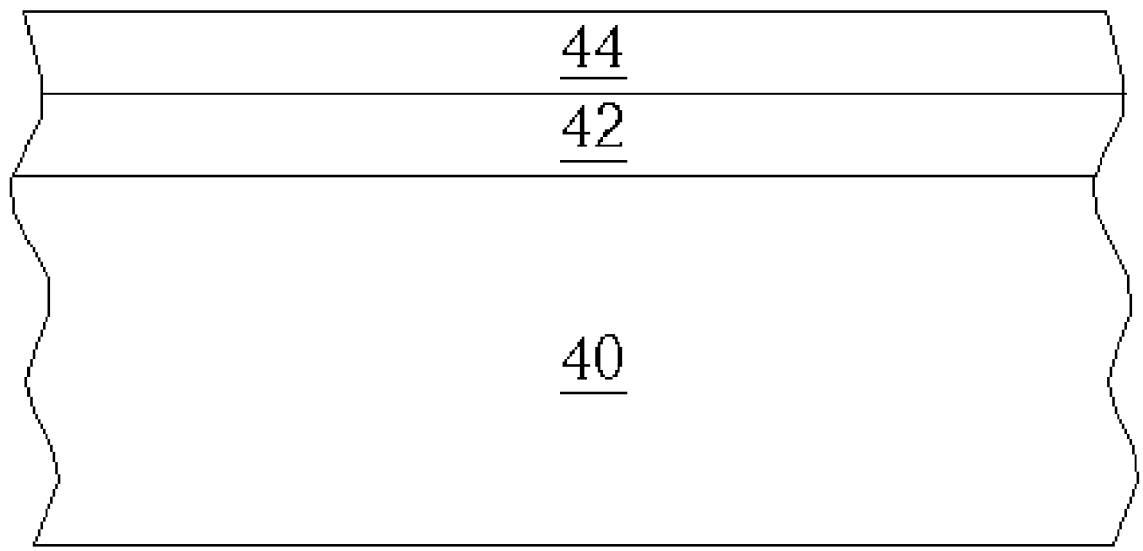
FIG. 5 to FIG. 10 are schematic views of forming and testing a phase shift mask (PSM) according to the present invention.

Please refer to FIG. 5 to FIG. 10 of schematic views of forming and testing a phase shift mask (PSM) according to the present invention. As shown in FIG. 5, a mask substrate 40 comprises a phase shift layer 42 and a screen layer 44 subsequently positioned on a surface of the mask substrate 40. Normally, the mask substrate 40, the phase shift layer 42 and the screen layer 44 are respectively composed of quartz, molybdenum silicide (MoSi) and chromium (Cr).

Figure 6:
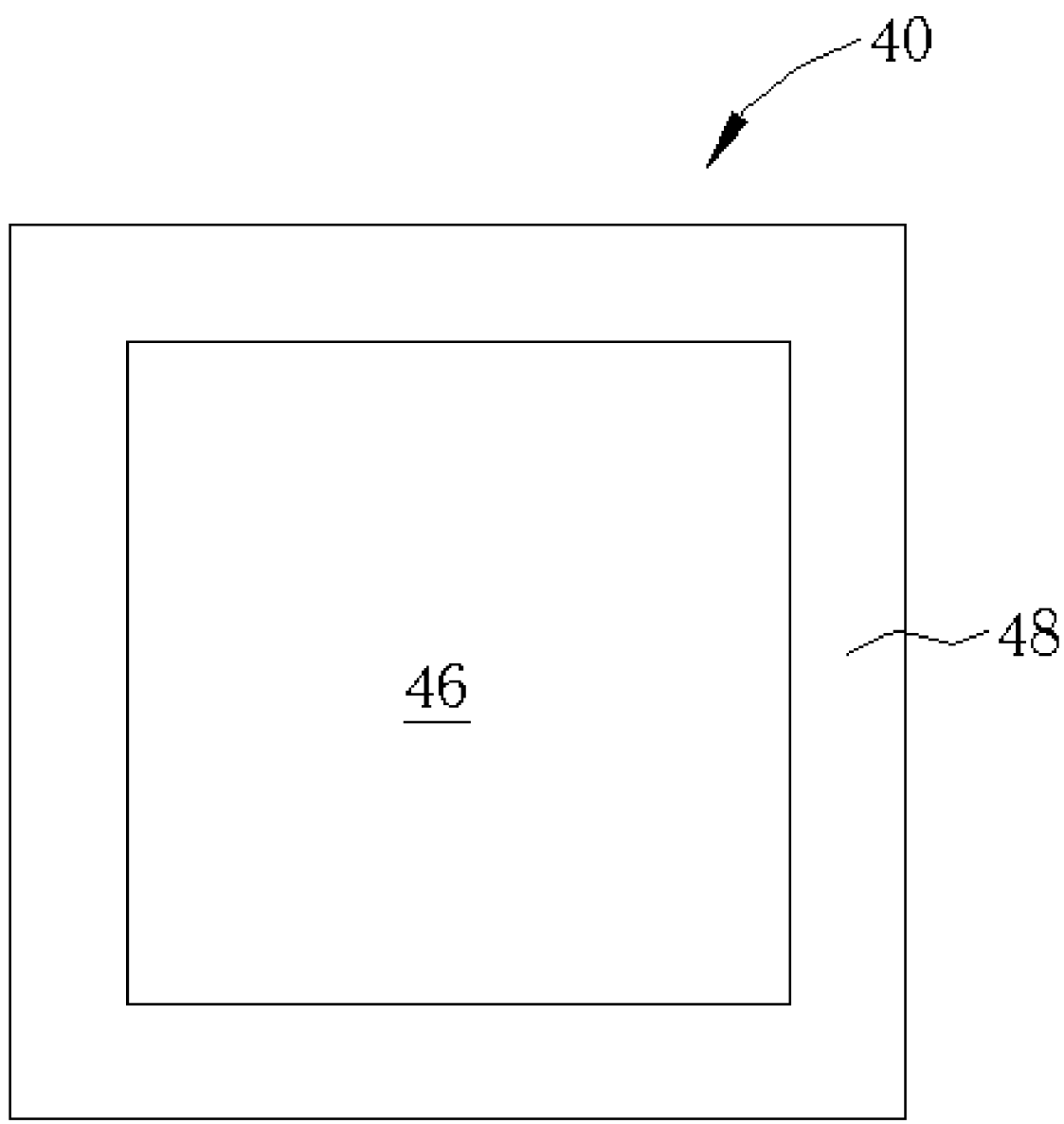
Figure 7:
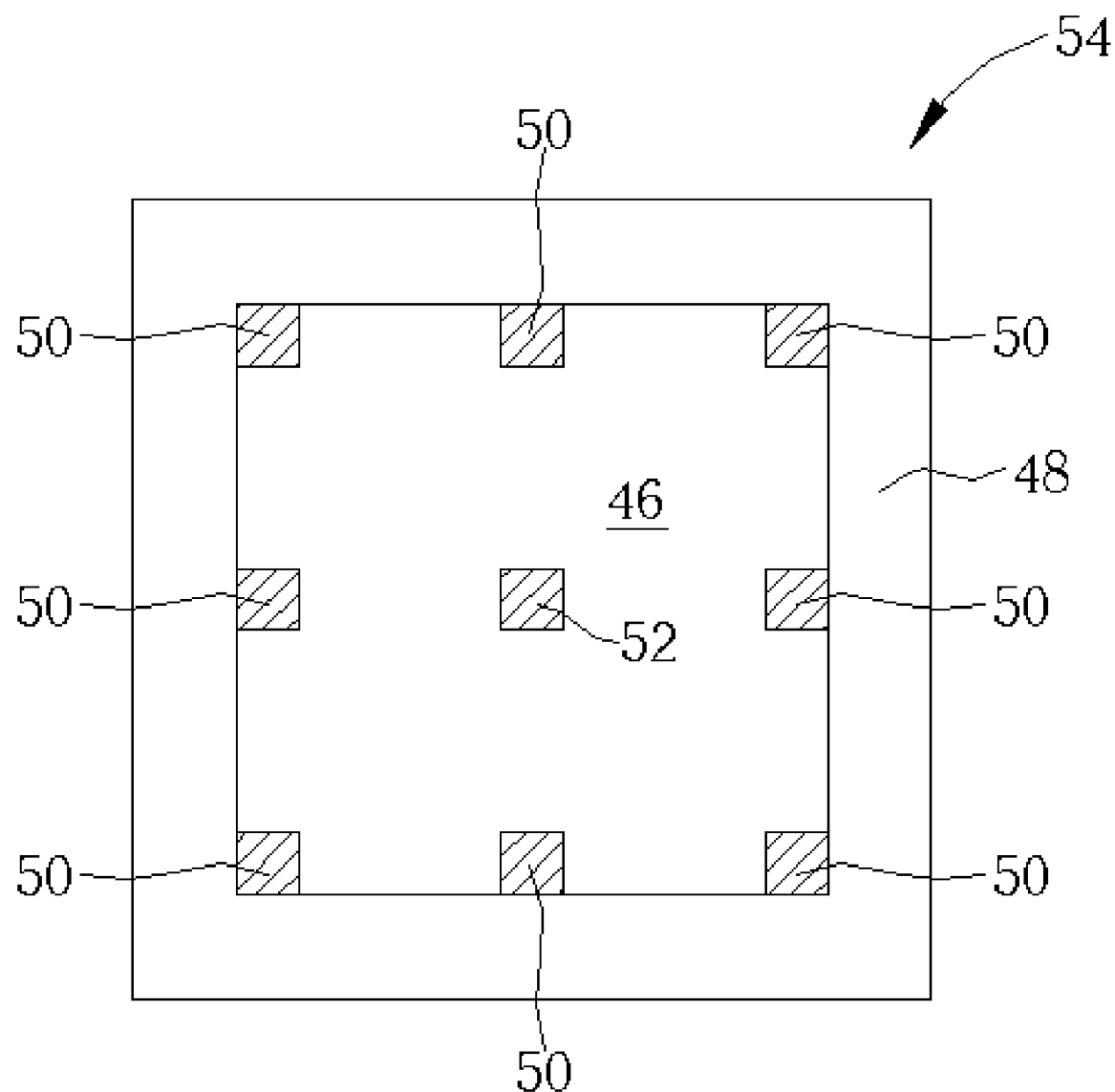

Please refer to FIG. 6 and FIG. 7 of top views of the mask substrate 40. As shown in FIG. 6, a surface of the mask substrate 40 comprises a main field region 46 and a blank periphery region 48 surrounding the main field region 46. A portion of a circuit pattern (not shown) is defined within the main field region 46, and the blank periphery region 48 is employed as an anti-static charge border of a PSM 54 formed in subsequent processes. For simplicity of description, both the phase shift layer 42 and the screen layer 44 are neglected in FIG. 6 and FIG. 7.

Figure 8:
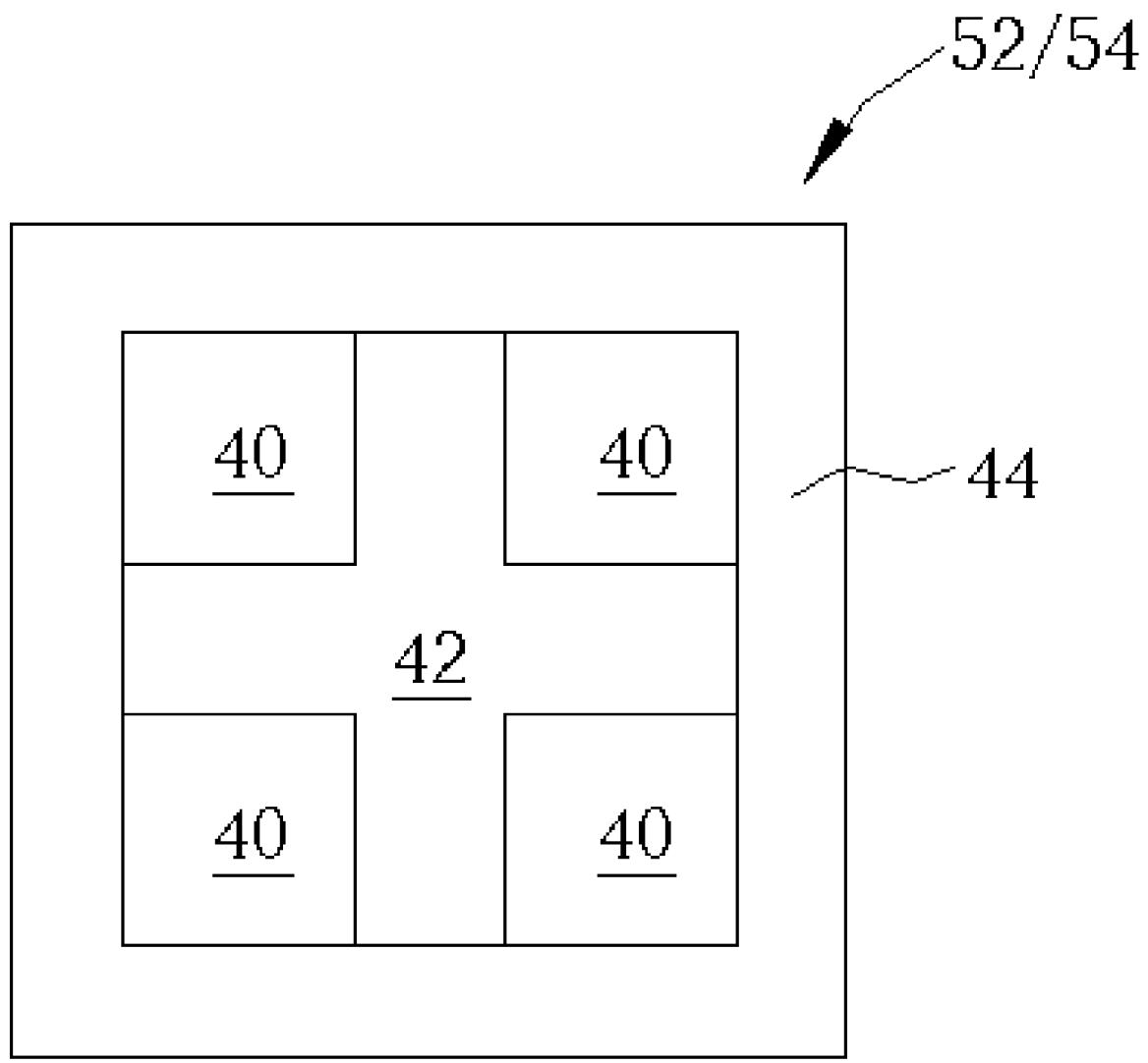
Figure 9:
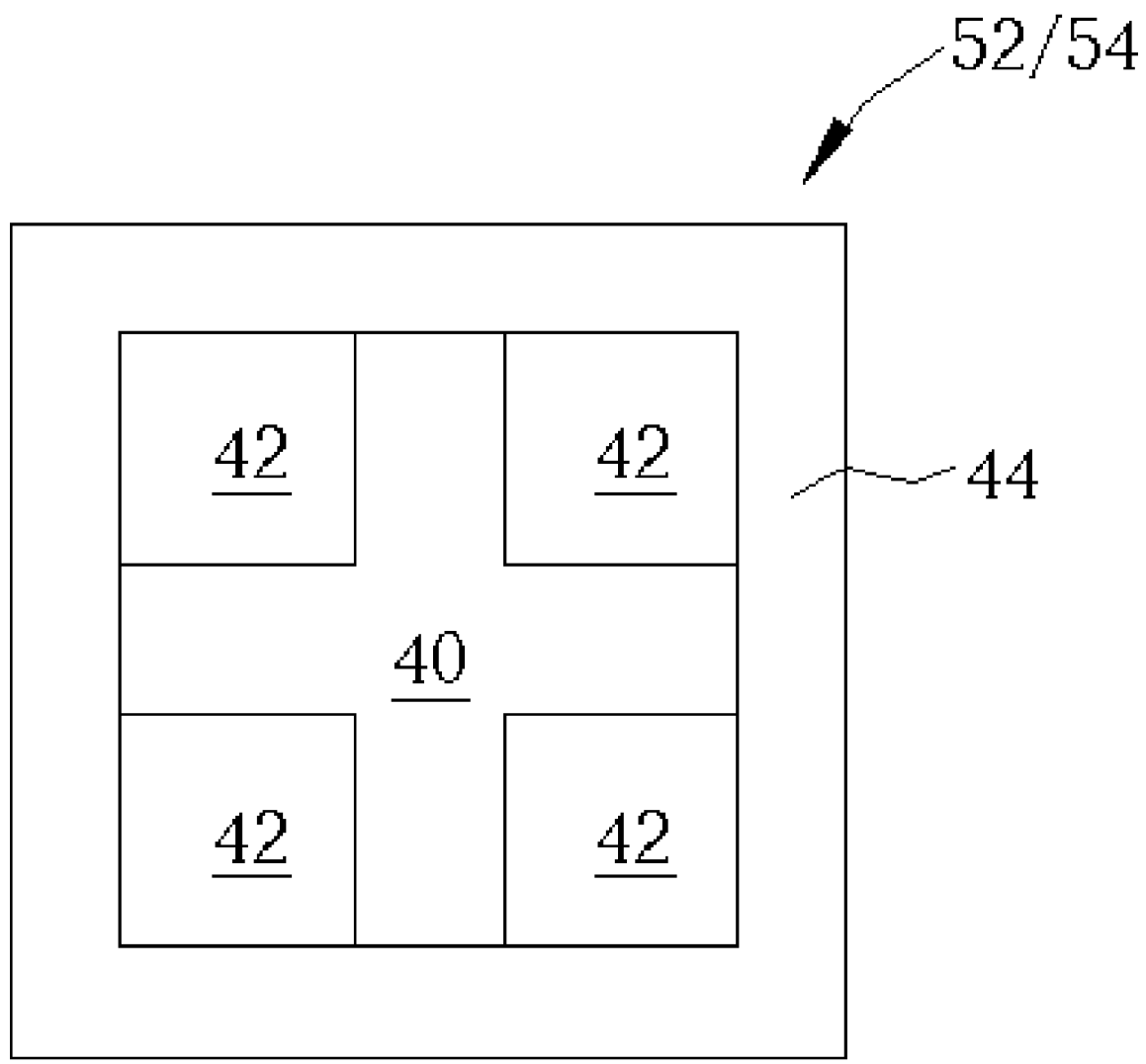

As shown in FIG. 7, at least one first registration pattern 50 and at least one second registration pattern 52 are respectively formed on the border and the center of the main field region 46 simultaneously, so as to form the PSM 54. Each of the portion of the circuit pattern, the first registration pattern 50 and the second registration pattern 52 is composed of the mask substrate 40, the phase shift layer 42 and the screen layer 44, and either the first registration pattern 50 or the second registration pattern 52 comprises an irregular-shaped pattern composed of the mask substrate 40, the phase shift layer 42 and the screen layer 44. Please refer to FIG. 8 and FIG. 9 of enlarged top views of either the first registration pattern 50 or the second registration pattern 52. As shown in FIG. 8, in the preferred embodiment of the present invention, either the first registration pattern 50 or the second registration pattern 52 comprises a cross-shaped pattern composed of the phase shift layer 42. As shown in FIG. 9, in another embodiment of the present invention, the cross-shaped pattern comprises the mask substrate 40.

Figure 10:
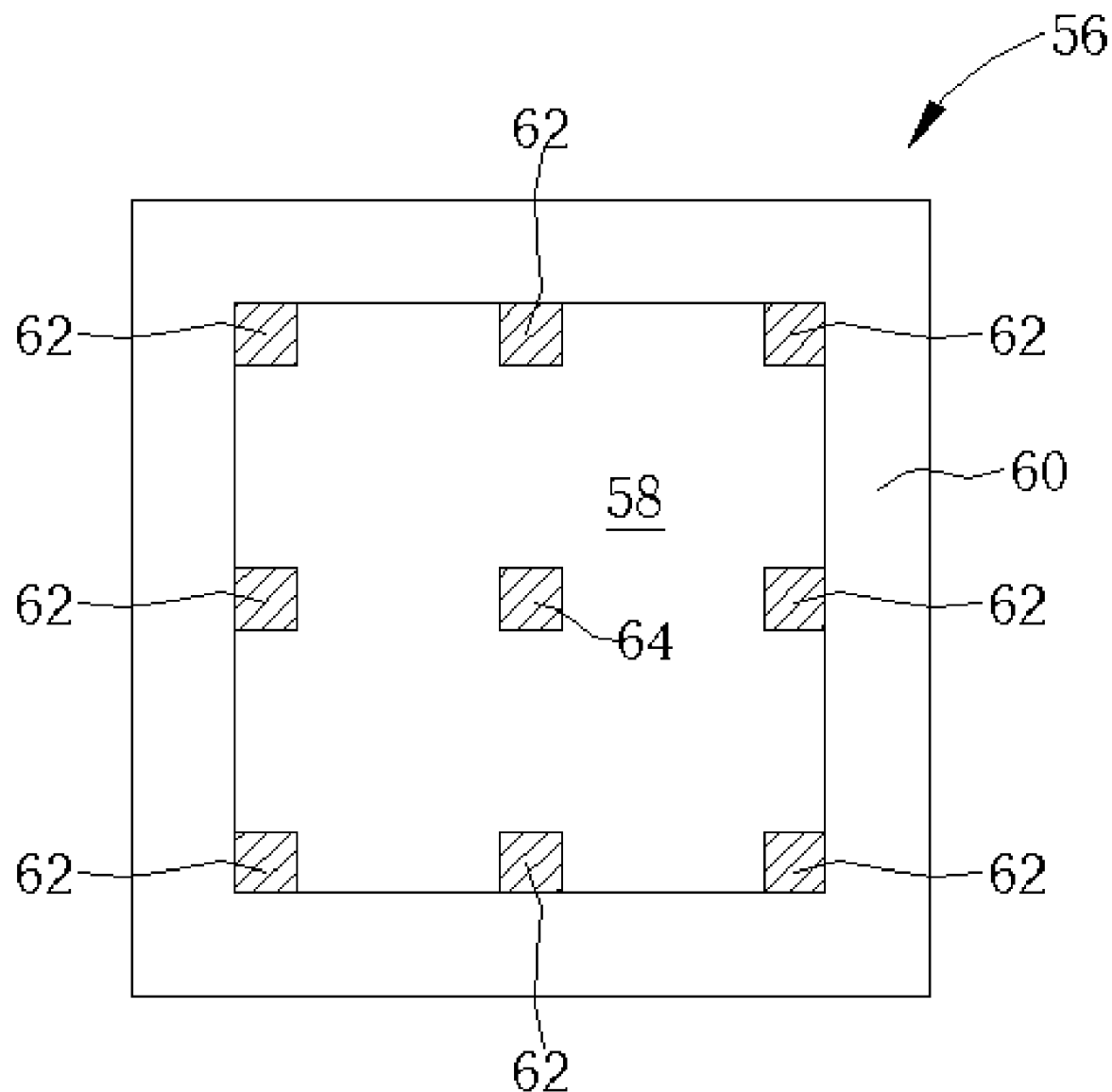

Please refer to FIG. 10 of the top view of a predetermined region 56 within a surface of a semiconductor wafer comprising a thin film layer (not shown) and a photosensitive layer (not shown) atop the surface of the semiconductor wafer. As shown in FIG. 10, a surface of the predetermined region 56 comprises a main field region 58 and a blank periphery region 60 surrounding the main field region 58. By using the PSM 54, a pattern transferring process, comprising a lithography process and an etching process, is performed to transfer the first registration pattern 50, the second registration pattern 52 and the portion of the circuit pattern to the predetermined region 56, so as to simultaneously form at least one first transferred pattern 62 and at least one second transferred pattern 64 respectively on the border and the center of the main field region 58.

In order to make sure that the portion of the circuit pattern is precisely transferred to the predetermined region 56, a phase shift mask test (PSM test) is performed by using the first transferred pattern 62, the second transferred pattern 64 and the alignment marks (not shown) mentioned in the prior art. As previously mentioned, the alignment marks are positioned on a scribe region of the semiconductor wafer and are called verniers as well. In the present invention, the PSM test comprises a registration test, a phase shift test and a transparency test that are simultaneously performed. In the preferred embodiment of the present invention, the first transferred pattern 62 within the predetermined region 56 is employed to perform the registration test, and the second transferred pattern 64 within the predetermined region 56 is employed to perform the phase shift test and the transparency test of the PSM test. In another embodiment of the present invention, either the first transferred pattern 62 or the second transferred pattern 64 is capable of being employed to perform either one of the registration test, the phase shift test or the transparency test.

In comparison with the prior art, a first pattern 50 and a second pattern 52 are respectively formed on the border and the center of the mask substrate 40 in the method of forming and testing the PSM 54 revealed in the present invention. Since the first transferred pattern 62 and the second transferred pattern 64 employed to perform the PSM test are both within the main field region 46, the etching uniformity of portions of the PSM 54 within the main field region 46 can be much more precisely monitored. In addition, the registration test, the phase shift test and the transparency test are performed in one single step. The manufacturing processes are therefore simplified, and the production lead-time is reduced as well. Consequently, the product turns to be more competitive due to the saved production cost.

Those skilled in the art will readily observe that numerous modifications and alterations of the device may be made while retaining the teachings of the invention. Accordingly, the above disclosure should be construed as limited only by the metes and bound of the appended claims.

What is claimed is:

1. A method of forming and testing a phase shift mask (PSM) comprising:
   providing a mask substrate, a surface of the mask substrate comprising a main field region and a blank periphery region surrounding the main field region;
   forming a first pattern, at least one second pattern and at least one third pattern within the main field region to form the PSM;
   using the PSM to perform a pattern transferring process to transfer the first pattern, the second pattern and the third pattern to a circuit region of a semiconductor wafer; and
   using the second and third patterns transferred to the circuit region of the semiconductor wafer to perform a PSM test.

2. The method of claim 1 wherein the blank periphery region is employed as an anti-static charge border of the PSM.

3. The method of claim 1 wherein the PSM test comprises at least one of a registration test, a phase angle test and a transparency test.

4. The method of claim 3 wherein the second pattern is positioned on the border of the main field region, and the transferred second pattern on the semiconductor wafer is employed to perform the registration test.

5. The method of claim 3 wherein the third pattern is positioned on the center of the main field region, and the transferred third pattern on the semiconductor wafer is employed to perform the phase angle test and the transparency test.

6. The method of claim 1 wherein the first pattern is a portion of a circuit pattern.

7. The method of claim 1 wherein either the first pattern, the second pattern or the third pattern is composed of the mask substrate, a phase shift layer and a screen layer.

8. The method of claim 7 wherein either the second pattern or the third pattern comprises a cross-shaped pattern composed of the mask substrate and the phase shift layer.

9. The method of claim 7 wherein the mask substrate comprises quartz, the phase shift layer comprises molybdenum silicide (MoSi), and the screen layer comprises chromium (Cr).

10. The method of claim 1 wherein the semiconductor wafer comprises a photosensitive layer positioned on a surface of the semiconductor wafer.

11. The method of claim 10 wherein the semiconductor wafer comprises a thin film layer positioned below the photosensitive layer.

12. The method of claim 1 wherein the pattern transferring process comprises a lithography process and an etching process.

13. A method of forming and testing a PSM comprising:
   providing a mask substrate, a surface of the mask substrate comprising a main field region and an anti-static charge border region surrounding the main field region;
   forming a first pattern and at least one second pattern within the main field region to form the PSM;
   using the PSM to perform a pattern transferring process to transfer the first pattern and the second pattern to a circuit region of a semiconductor wafer; and
   using the second pattern transferred to the circuit region of the semiconductor wafer to perform a PSM test.

14. The method of claim 13 wherein the first pattern is a portion of a circuit pattern.

15. The method of claim 13 wherein the second pattern is positioned on either the border or the center of the main field region.

16. The method of claim 13 wherein either the first pattern or the second pattern is composed of the mask substrate, a phase shift layer and a screen layer.

17. The method of claim 16 wherein the second pattern comprises a cross-shaped pattern composed of the mask substrate and the phase shift layer.

18. The method of claim 17 wherein the PSM test comprises a registration test, a phase angle test and a transparency test.

19. The method of claim 13 wherein the semiconductor wafer comprises a photosensitive layer position on a surface of the semiconductor wafer.

20. The method of claim 19 wherein the semiconductor wafer comprises a thin film layer positioned below the photosensitive layer, and the pattern transferring process comprises a lithography process and an etching process.

* * * * *